United States Patent
Lin (10) Patent No.: US 11,250,778 B2
(45) Date of Patent: Feb. 15, 2022

(54) DRIVER SELECTION CIRCUIT FOR DISPLAY PANEL, AND DISPLAY PANEL AND DISPLAY DEVICE

(71) Applicants: HKC Corporation Limited, Shenzhen (CN); Chongqing HKC Optoelectronics Technology Co., Ltd., Chongqing (CN)

(72) Inventor: Pei Hsin Lin, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 17/042,794

(22) PCT Filed: Nov. 14, 2018

(86) PCT No.: PCT/CN2018/115308
§ 371 (c)(1),
(2) Date: Sep. 28, 2020

(87) PCT Pub. No.: WO2020/093424
PCT Pub. Date: May 14, 2020

(65) Prior Publication Data
US 2021/0027703 A1    Jan. 28, 2021

(30) Foreign Application Priority Data
Nov. 7, 2018   (CN) .................. 201821831966.X (51) Int. Cl.
*G09G 3/30* (2006.01)
*G09G 3/36* (2006.01)
(Continued)

(52) U.S. Cl.
CPC ............. *G09G 3/325* (2013.01); *G09F 9/301* (2013.01); *G09G 3/035* (2020.08); *G09G 3/3659* (2013.01);
(Continued)

(58) Field of Classification Search
CPC ....... G09G 3/2085–2092; G09G 3/325; G09G 3/3659; G09G 3/296–3696; G09G 9/301;
(Continued)

(56) References Cited

U.S. PATENT DOCUMENTS

| 5,619,225 A  *  | 4/1997 | Hashimoto  .......... | G09G 3/2011 345/88 |
| 2013/0215092 A1* | 8/2013 | Wu ....................... | G09G 3/3233 345/206 |

(Continued)

FOREIGN PATENT DOCUMENTS

| CN | 103927962 A  | 7/2014 |
| CN | 106448594 A  | 2/2017 |
| JP | 2008065295 A | 3/2008 |

OTHER PUBLICATIONS

International Search Report dated Jul. 25, 2019 issued in corresponding International Application No. PCT/CN2018/115308, filed Nov. 14, 2018, 2 pages.

*Primary Examiner* — Sanghyuk Park
(74) *Attorney, Agent, or Firm* — Hauptman Ham, LLP (57) ABSTRACT

The present application relates to a driving selection circuit for a display panel. The driving selection circuit comprises a first multiplexer circuit provided between a display area and a first data driving circuit, and a second multiplexer circuit provided between the display area and a second data driving circuit. Further provided are a display panel and a display apparatus.

20 Claims, 5 Drawing Sheets

(51) Int. Cl.
  *G09G 3/325*    (2016.01)
  *G09G 3/00*     (2006.01)
  *G09F 9/30*     (2006.01)
  *H05K 1/03*     (2006.01)

(52) U.S. Cl.
  CPC ... *H05K 1/0393* (2013.01); *G09G 2310/0278* (2013.01); *G09G 2320/02* (2013.01); *G09G 2380/02* (2013.01)

(58) Field of Classification Search
  CPC ....... G09G 2310/0278; G09G 2320/02; G09G 2380/02; H05K 1/0393
  See application file for complete search history.

(56) References Cited

U.S. PATENT DOCUMENTS

2016/0267862 A1*  9/2016  Yao ..................... G09G 3/3611
2018/0240421 A1*  8/2018  Yamazaki ............ G09G 3/3648

\* cited by examiner

DRIVER SELECTION CIRCUIT FOR DISPLAY PANEL, AND DISPLAY PANEL AND DISPLAY DEVICE

CROSS-REFERENCE TO RELATED APPLICATIONS

This application claims the benefit of Chinese Patent Application No. 201821831966.X, entitled "DRIVING SELECTION CIRCUIT FOR DISPLAY PANEL, AND DISPLAY PANEL AND DISPLAY APPARATUS", filed on Nov. 7, 2018, the entire content of which is incorporated herein in its entirety.

TECHNICAL FIELD

The present disclosure relates to a field of display technology, and particularly to a driver selection circuit for a display panel, a display panel, and a display device.

BACKGROUND

With the development of display technology, display devices are widely used due to their high image quality, power saving, thin body, large size, etc. Among them, high image quality and large size are the main factors affecting the consumer's experience. Under this premise, various manufacturers have successively produced display devices with higher image quality and larger size to meet the demands of users. However, in a scenario that a display device with small size and high quality is required, how to achieve small size and high image quality at the same time is a very important problem. With regards to PPI (Pixels per Inch), the higher the PPI, the better. Therefore, achieving smaller size and high quality while pursuing high PPI could be a big challenge, because as the size of the display panel becomes smaller, it will face a physical limit when the size is smaller than 32 inches. In other words, COF (Chip on Film) used for bonding cannot be placed unilaterally, in this case, the COF is placed bilaterally. Since the COF is placed bilaterally, the data is also written bilaterally. Therefore, when the data is required to be written unilaterally, how to control the data to switch between unilateral and bilateral input is an urgent problem to be solved.

SUMMARY

According to various embodiments of the present disclosure, a driver selection circuit for a display panel that are capable of controlling data to switch between unilateral and bilateral input is provided.

Additionally, a display panel and a display device are also provided.

A driver selection circuit for a display panel, the display panel includes a display area and a non-display area. The display area is provided with a plurality of data lines, and the driver selection circuit for the display panel includes:

a data driving circuit, including a first data driving circuit and a second data driving circuit, the first data driving circuit being located on a side of the display panel, and the second data driving circuit being located on an opposite side, the first data driving circuit including a plurality of first source driving circuits, and the second data driving circuit including a plurality of second source driving circuits; and a multiplexer circuit, including a first multiplexer circuit and a second multiplexer circuit, the first multiplexer circuit being located between the display area and the first data driving circuit, and the second multiplexer circuit being located between the display area and the second data driving circuit, the first multiplexer circuit including a plurality of first switching devices, and the second multiplexer circuit including a plurality of second switching devices. The plurality of first switching devices are connected to one of the first source driving circuits, and the plurality of second switching devices are connected to one of the second source driving circuits, the first multiplexer circuit controls each of the first switching devices to be simultaneously turned on or off according to an inputted first control signal, and the second multiplexer circuit controls each of the second switching devices to be simultaneously turned on or off according to an inputted second control signal.

A display panel using a driver selection circuit for the display panel to drive, the display panel comprising a display area and a non-display area, the display area being provided with a plurality of data lines, wherein the driver selection circuit for the display panel includes:

a data driving circuit, including a first data driving circuit and a second data driving circuit, the first data driving circuit being located on a side of the display panel, and the second data driving circuit being located on an opposite side, the first data driving circuit including a plurality of first source driving circuits, and the second data driving circuit including a plurality of second source driving circuits; and a multiplexer circuit, including a first multiplexer circuit and a second multiplexer circuit, the first multiplexer circuit being located between the display area and the first data driving circuit, and the second multiplexer circuit being located between the display area and the second data driving circuit, the first multiplexer circuit including a plurality of first switching devices, and the second multiplexer circuit including a plurality of second switching devices. The plurality of first switching devices are connected to one of the first source driving circuits, and the plurality of second switching devices are connected to one of the second source driving circuits, the first multiplexer circuit controls each of the first switching devices to be simultaneously turned on or off according to an inputted first control signal, and the second multiplexer circuit controls each of the second switching devices to be simultaneously turned on or off according to an inputted second control signal.

A display device includes a display panel, the display panel using a driver selection circuit for the display panel to drive, the display panel including a display area and a non-display area, the display area being provided with a plurality of data lines, the driver selection circuit for the display panel includes:

a data driving circuit, including a first data driving circuit and a second data driving circuit, the first data driving circuit being located on a side of the display panel, and the second data driving circuit being located on an opposite side, the first data driving circuit including a plurality of first source driving circuits, and the second data driving circuit including a plurality of second source driving circuits; and a multiplexer circuit, including a first multiplexer circuit and a second multiplexer circuit, the first multiplexer circuit being located between the display area and the first data driving circuit, and the second multiplexer circuit being located between the display area and the second data driving circuit, the first multiplexer circuit including a plurality of first switching devices, and the second multiplexer circuit including a plurality of second switching devices. The plurality of first switching devices are connected to one of the first source driving circuits, and the plurality of second switching devices are connected to one of the second source driving circuits, the first multiplexer circuit controls each of the first switching devices to be simultaneously turned on or off according to an inputted first control signal, and the second multiplexer circuit controls each of the second switching devices to be simultaneously turned on or off according to an inputted second control signal.

In the aforementioned driver selection circuit for the display panel, the display panel, and the display device, the first multiplexer circuit is located between the display area and the first data driving circuit, and the second multiplexer circuit is located between the display area and the second data driving circuit. The first data driving circuit includes a plurality of first source driving circuits, and the second data driving circuit includes a plurality of second source driving circuits. The first multiplexer circuit including a plurality of first switching devices, and the second multiplexer circuit including a plurality of second switching devices. The plurality of first switching devices are connected to one of the first source driving circuits, and the plurality of second switching devices are connected to one of the second source driving circuits, the first multiplexer circuit controls each of the first switching devices to be simultaneously turned on or off according to an inputted first control signal, and the second multiplexer circuit controls each of the second switching devices to be simultaneously turned on or off according to an inputted second control signal. Therefore, the data driving voltage signals output from the source driving circuits to the data lines can be controlled, so as to achieve the switching between unilateral and bilateral input of the data signals in the display panel.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

Embodiments of the present disclosure are described more fully hereinafter with reference to the accompanying drawings. A preferred embodiment is described in the accompanying drawings. The various embodiments of the present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

Unless otherwise defined, all terms (including technical and scientific terms) used herein have the same meaning as commonly understood by one of ordinary skill in the art to which this invention belongs. The terms used herein is for the purpose of describing particular embodiments only and is not intended to limit the present disclosure. As used herein, the term "and/or" includes any and all combinations of one or more of the associated listed items.

Figure 1:
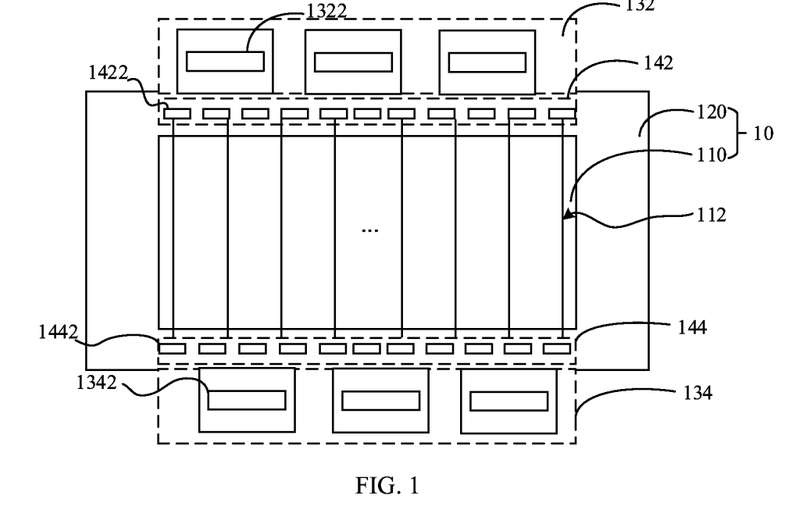
FIG. 1 is a schematic diagram of a driver selection circuit for a display panel according to an embodiment.

Referring to FIG. 1, a schematic diagram of a driver selection circuit for a display panel according to an embodiment is shown. The driver selection circuit for the display panel can include data driving circuits (not shown), and multiplexer circuits (not shown). The display panel 10 can include a display area 110 and a non-display area 120, a plurality of data lines 112 are provided in the display area 110. The display area 110 is a portion of area that displays image information, and it can also be referred as an active area. Generally, the non-display area 120 is an area without image display, and this area is mainly used to press some lines and sensors into this area. The data driving circuit can include a first data driving circuit 132 and a second data driving circuit 134, the first data driving circuit 132 is located on a side of the display panel 10, and the second data driving circuit 134 is located on an opposite side. The first data driving circuit 132 includes a plurality of first source driving circuits 1322, and the second data driving circuit 134 includes a plurality of second source driving circuits 1342.

The multiplexer circuit can include a first multiplexer circuit 142 and a second multiplexer circuit 144. The first multiplexer circuit 142 is located between the display area 110 and the first data driving circuit 132, and the second multiplexer circuit 144 is located between the display area 100 and the second data driving circuit 134. The first multiplexer circuit 142 includes a plurality of first switching devices 1442, and the second multiplexer circuit 144 includes a plurality of second switching devices 1442. The plurality of first switching devices 1422 are connected to one of the first source driving circuits 1322, and the plurality of second switching devices 1442 are connected to one of the second source driving circuits 1342. The first multiplexer circuit 142 controls each of the first switching devices 1422 to be simultaneously turned on or off according to an inputted first control signal, and the second multiplexer circuit 144 controls each of the second switching devices 1442 to be simultaneously turned on or off according to an inputted second control signal.

In the aforementioned driver selection circuit for the display panel, the first multiplexer circuit is located between the display area and the first data driving circuit, and the second multiplexer circuit is located between the display area and the second data driving circuit. The first data driving circuit includes a plurality of first source driving circuits, and the second data driving circuit includes a plurality of second source driving circuits. The first multiplexer circuit including a plurality of first switching devices, and the second multiplexer circuit including a plurality of second switching devices. The plurality of first switching devices are connected to one of the first source driving circuits, and the plurality of second switching devices are connected to one of the second source driving circuits, the first multiplexer circuit controls each of the first switching devices to be simultaneously turned on or off according to an inputted first control signal, and the second multiplexer circuit controls each of the second switching devices to be simultaneously turned on or off according to an inputted second control signal. Therefore, the data driving voltage signals output from the source driving circuits to the data lines can be controlled, so as to achieve the switching between unilateral and bilateral input of the data signals in the display panel.

Figure 2:
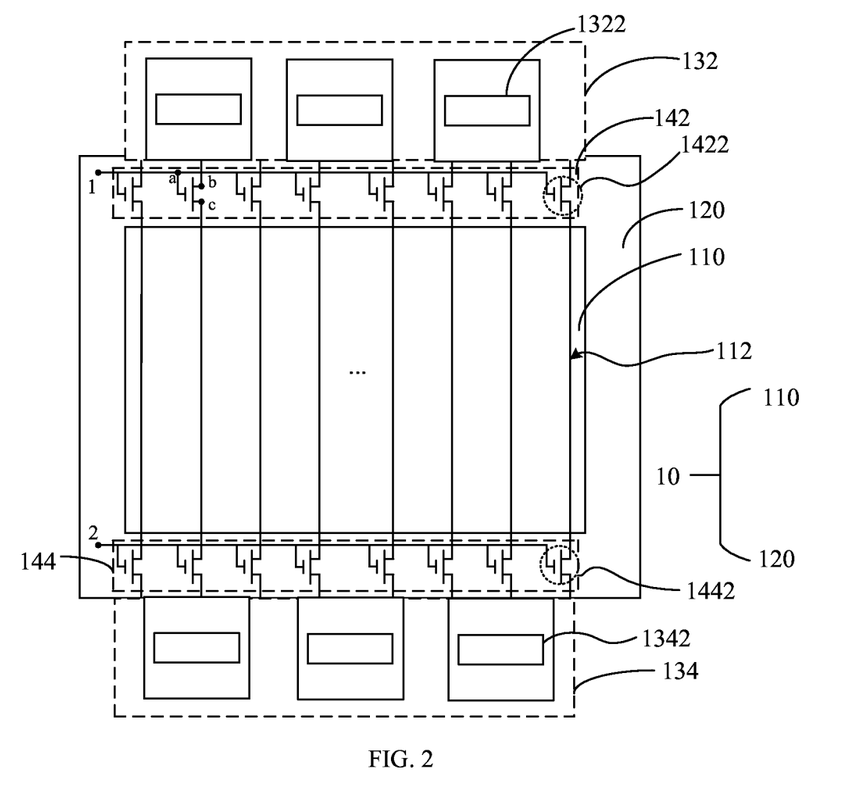
FIG. 2 is a schematic diagram of a driver selection circuit for a display panel according to another embodiment.

Referring to FIG. 2, a schematic diagram of a driver selection circuit for a display panel according to another embodiment is shown. The driver selection circuit for the display panel can include data driving circuits (not shown), and multiplexer circuits (not shown). The display panel 10 can include a display area 110 and a non-display area 120, a plurality of data lines 112 are provided in the display area 110. The data driving circuit can include a first data driving circuit 132 and a second data driving circuit 134, the first data driving circuit 132 is located on a side of the display panel 10, and the second data driving circuit 134 is located on an opposite side. The first data driving circuit 132 includes a plurality of first source driving circuits 1322, and the second data driving circuit 134 includes a plurality of second source driving circuits 1342. The multiplexer circuit can include a first multiplexer circuit 142 and a second multiplexer circuit 144. The first multiplexer circuit 142 is located between the display area 110 and the first data driving circuit 132, and the second multiplexer circuit 144 is located between the display area 100 and the second data driving circuit 134. The first multiplexer circuit 142 includes a plurality of first switching devices 1442, and the second multiplexer circuit 144 includes a plurality of second switching devices 1442. The plurality of first switching devices 1422 are connected to one of the first source driving circuits 1322, and the plurality of second switching devices 1442 are connected to one of the second source driving circuits 1342. The first multiplexer circuit 142 controls each of the first switching devices 1422 to be simultaneously turned on or off according to an inputted first control signal, and the second multiplexer circuit 144 controls each of the second switching devices 1442 to be simultaneously turned on or off according to an inputted second control signal. Additionally, the first switching devices 1422 and the second switching devices 1442 are thin film transistors. Gates of each of the thin film transistors are connected to a same first signal output terminal 1 of the first multiplexer circuit 142, the first signal output terminal 1 is configured to output a first signal, and the gates of each of the thin film transistors are connected to a same second signal output terminal 2 of the second multiplexer circuit 144, the second signal output terminal 2 is configured to output a second signal, sources of each of the thin film transistors are connected to data output terminals of the data lines 112, and drains of the thin film transistors are connected to data input terminals of the data lines 112 in the display area 110. The multiplexer circuit can also be referred as a de-mux circuit. As shown in FIG. 2, for example, a first switching device in a first multiplexer module 142 is a thin film transistor, the gate a of the thin film transistor is connected to the first signal output terminal 1 of the first multiplexer circuit 142, the source b of the thin film transistor is connected to the data output terminal of the data line 112, and drain c of the thin film transistors is connected to data input terminal of the data line 112.

When the first signal output terminal 1 of the first multiplexer module 142 receives a high level, and the second signal output terminal 2 of the second multiplexer module 144 receives a low level, the gates of the plurality of the thin film transistors connected to the first signal output terminal 1 receive the high level and are turned on, the gates of the plurality of the thin film transistors connected to the second signal output terminal 2 receive the low level and are cut off, thus at this time, the data writing of the display panel 10 is switched to an unilateral writing, i.e., the data is written from the side where the first signal output terminal 1 is located. When the first signal output terminal 1 of the first multiplexer circuit 142 receives a low level, and the second signal output terminal 2 of the second multiplexer circuit 144 receives a low level, all of the gates of the thin film transistor connected to the first signal output terminal 1 and the gates of the thin film transistor connected to the second signal output terminal 2 receive the low level and are cut off, as this time, no data driving voltage signal is inputted to the display panel 10, i.e., no data in written. When the first signal output terminal 1 of the first multiplexer circuit 142 receives a low level, and the second signal output terminal 2 of the second multiplexer circuit 144 receives a high level, the gates of the thin film transistors connected to the first signal output terminal 1 receive the low level and are cut off, and the gates of the thin film transistor connected to the second signal output terminal 2 receive high level and are turned on, thus at this time the data writing of display panel 10 is switched to an unilateral writing, i.e., the data is written from the side where the second signal output terminal 2 is located. When the first signal output terminal 1 of the first multiplexer circuit 142 receives a high level, and the second signal output terminal 2 of the second multiplexer circuit 144 receives a high level, all of the gates of the thin film transistor connected to the first signal output terminal 1 and the gates of the thin film transistor connected to the second signal output terminal 2 receive the high level and are switched on, thus at this time, the data writing of the display panel 10 is switched to a bilateral writing, i.e., the data is written from both sides where the first signal output terminal 1 and the second signal output terminal 2 are located.

In the aforementioned embodiment, the first multiplexer circuit is located between the display area and the first data driving circuit, and the second multiplexer circuit is located between the display area and the second data driving circuit. The first data driving circuit includes a plurality of first source driving circuits, and the second data driving circuit includes a plurality of second source driving circuits. The first multiplexer circuit including a plurality of first switching devices, and the second multiplexer circuit including a plurality of second switching devices. The plurality of first switching devices are connected to one of the first source driving circuits, and the plurality of second switching devices are connected to one of the second source driving circuits, the first multiplexer circuit controls each of the first switching devices to be simultaneously turned on or off according to an inputted first control signal, and the second multiplexer circuit controls each of the second switching devices to be simultaneously turned on or off according to an inputted second control signal. Therefore, the data driving voltage signals output from the source driving circuits to the data lines can be controlled, so as to achieve the switching between unilateral and bilateral input of the data signals in the display panel. Additionally, the first switching devices and the second switching devices are thin film transistors, gates of each of the thin film transistors are connected to a same first signal output terminal of the first multiplexer circuit, and the gates of each of the thin film transistors are connected to a same second signal output terminal of the second multiplexer circuit, sources of each of the thin film transistors are connected to data output terminals of the data lines, and drains of the thin film transistors are connected to data input terminals of the data lines in the display area. Therefore according to the present disclosure, the date driving voltage signal outputted from a source driving unit to the data lines can be controlled under the high or low level control signal, so as to achieve the switching between unilateral and bilateral input of the data signals in the display panel.

Figure 3:
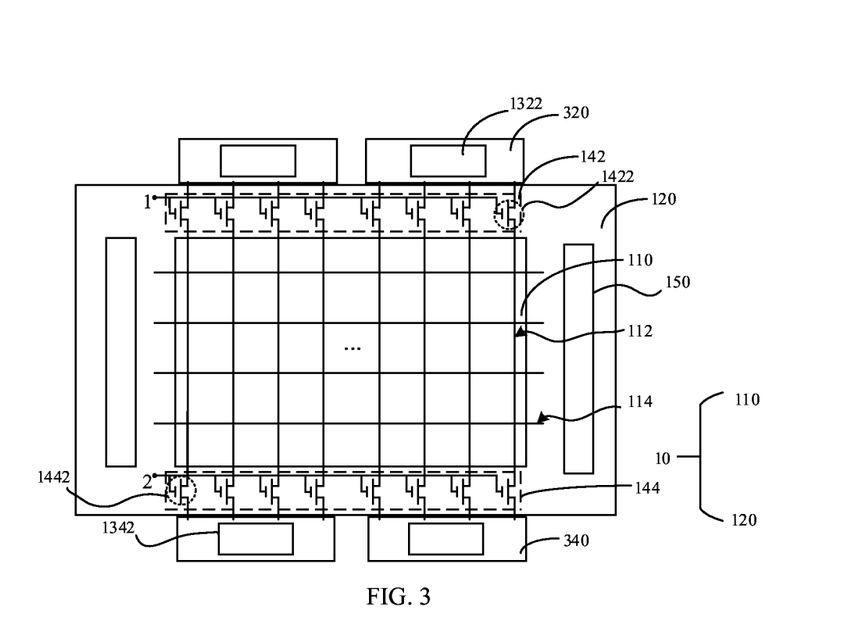
FIG. 3 is a schematic diagram of a display panel according to an embodiment.

Referring to FIG. 3, a schematic diagram of a display panel according to an embodiment is shown, and the display panel 10 uses the aforementioned driver selection circuit for the display panel to drive. The display panel 10 can include a display area 110 and a non-display area 120. The display area 110 is a portion of area that displays image information, and it can also be referred as an active area. Generally, the non-display area 120 is an area without image display, and this area is mainly used to press some lines and sensors into this area. With the development of display technology, display devices are widely used due to their high image quality, power saving, thin body, large size, etc. Among them, high image quality and large size are the main factors affecting the consumer's experience. Under this premise, various manufacturers have successively produced display devices with higher image quality and larger size to meet the demands of users. However, in a scenario that a display device with small size and high quality is required, how to achieve small size and high image quality at the same time is a very important problem. In the application, for example, the display panel 10 can be a TFT-LCD (Thin Film Transistor Liquid Crystal Display) display panel, an OLED (Quantum Dot Light Emitting Diode) display panel, a curved surface display panel, or any other display panel. The display area 110 are provided with a plurality of data lines 112 and a plurality of grating lines 114. The grating lines 114 are also referred as scan lines, the plurality of grating lines 114 extend along a first direction, and are arranged along a second direction. The plurality of data lines 112 extend along the second direction, and are arranged along the first direction. In other words, the extending directions and the arranging directions of the data lines 112 and the grating lines 114 are opposite. I.e., the extending direction of the data lines 112 is the arranging direction of the grating lines 114, and the arranging direction of the data lines 112 is the extending direction of the grating lines 114. The first direction and the second direction are perpendicular to each other. Referring to FIG. 3, the first direction can be understood as the horizontal direction, i.e., the extending direction of the X-axis in the two-dimensional coordinates, and the second direction can be understood as the vertical direction, i.e., the extending direction of the Y-axis in the two-dimensional coordinates.

Referring to FIG. 3, the display panel 10 further includes at least one array substrate row driving circuit 150. Each of the array substrate row driving circuits 150 are located on one or both sides adjacent to the first source driving circuits 1322. The array substrate row driving circuit 150 is configured to output a scan driving voltage signal to drive the grating lines to turn on or off. The array substrate row driving circuit 150 can also be referred as a gate driver on array (GOA) unit. The array substrate row driving circuit 150 directly forms the gate driver circuit around the display panel, generally, the gate driver circuit is provided on the non-display area 120 of the display panel 10. By this configuration, the production process can be reduced, the production cost is decreased, the integration of a panel is improved, and a narrow boarder is achieved. The array substrate row driving circuit 150 generates a gating signal mainly based on a clock control signal, that is, the scan driving voltage signal, which is used to control the writing of color data.

Figure 4:
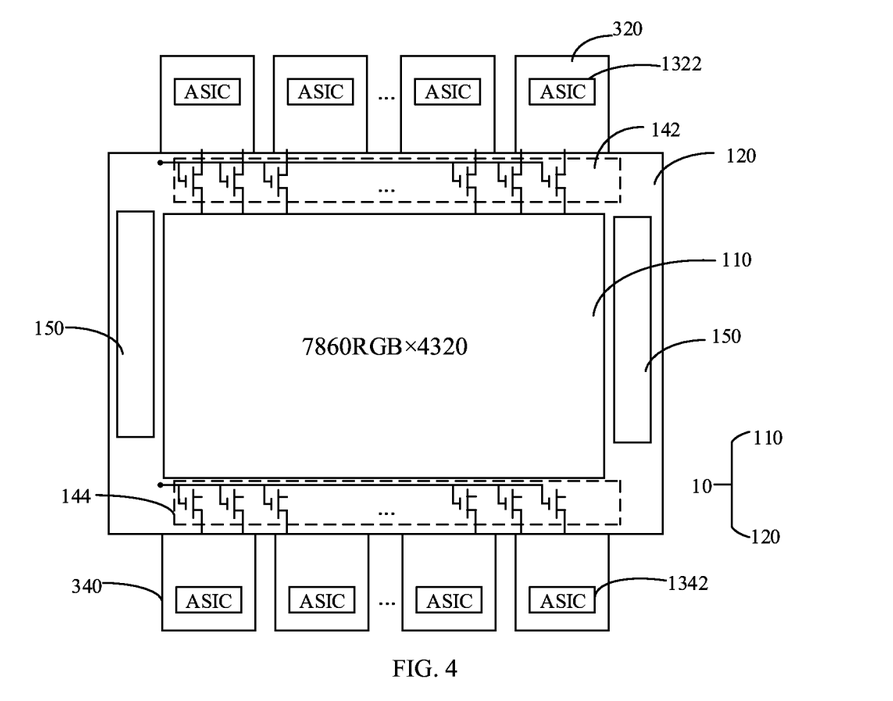
FIG. 4 is a schematic diagram of an 8K4K display panel according to another embodiment.

Additionally, referring to FIG. 4, which is a schematic diagram of an 8K4K display panel according to another embodiment. The resolution of the 8K4K display panel is 7680RGB×4320. That is, 7680×3=23040 data lines and 4320 scan lines are provided in the display area 110. In the illustrated embodiment, both side adjacent to the first source driving circuits 1322 are provided with one array substrate row driving circuit 150. Additionally, by providing one array substrate row driving circuit 150 on both side of the first source driving circuit 1322, the scan driving voltage signal of the display panel 10 can be inputted from the upper and lower edges of the display area 110, and scans towards the middle of the display area 100 line by line, In this way, the driving voltage input time of each of the scan lines is increased (i.e., the charging time of each of the pixel units of the display area 110 is increased), thereby ensuring that the display panel 10 has a good gray scale display, further improving the display effect. Moreover, by employing the aforementioned driver selection circuit for the display panel, the switching between unilateral and bilateral input of the data signals in the display panel can be achieved.

Figure 5:
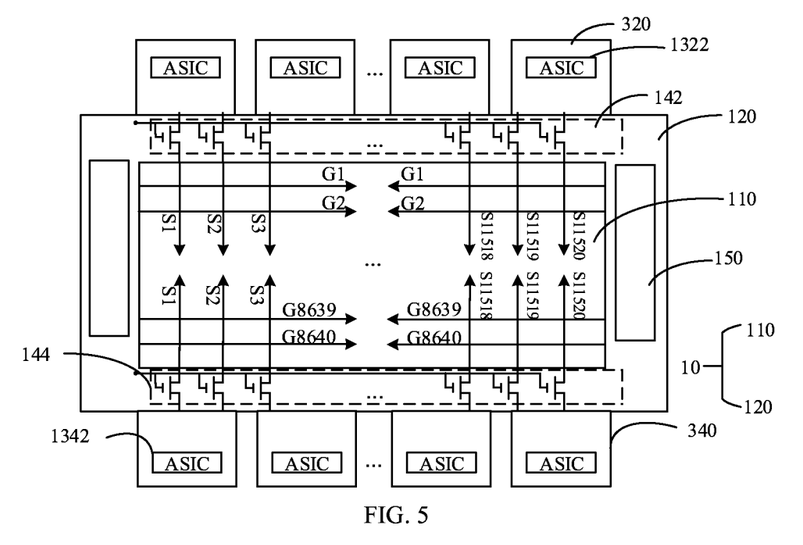
FIG. 5 is a schematic diagram of a 8K4K HSD display panel according to another embodiment.

Additionally, referring to FIG. 5, which is a schematic diagram of a 8K4K HSD display panel according to another embodiment. The resolution of the 8K4K HSD display panel is 7680RGB/2×4320 (half source driver display). That is, 7680×3/2=11520 data lines and 4320×2=8640 scan lines are provided in the display area 110. In the illustrated embodiment, both side adjacent to the first source driving circuits 1322 are provided with one array substrate row driving circuit 150. Additionally, by providing one array substrate row driving circuit 150 on both side of the source driving unit 132, the scan driving voltage signal of the display panel 10 can be inputted from the middle of the display area 110, and scans towards the upper and lower edges of the display area 100 line by line, In this way, the driving voltage input time of each of the scan lines is increased (i.e., the charging time of each of the pixel units of the display area 110 is increased), thereby ensuring that the display panel 10 has a good gray scale display, further improving the display effect. Moreover, by employing the aforementioned driver selection circuit for the display panel, the switching between unilateral and bilateral input of the data signals in the display panel can be achieved.

Figure 6:
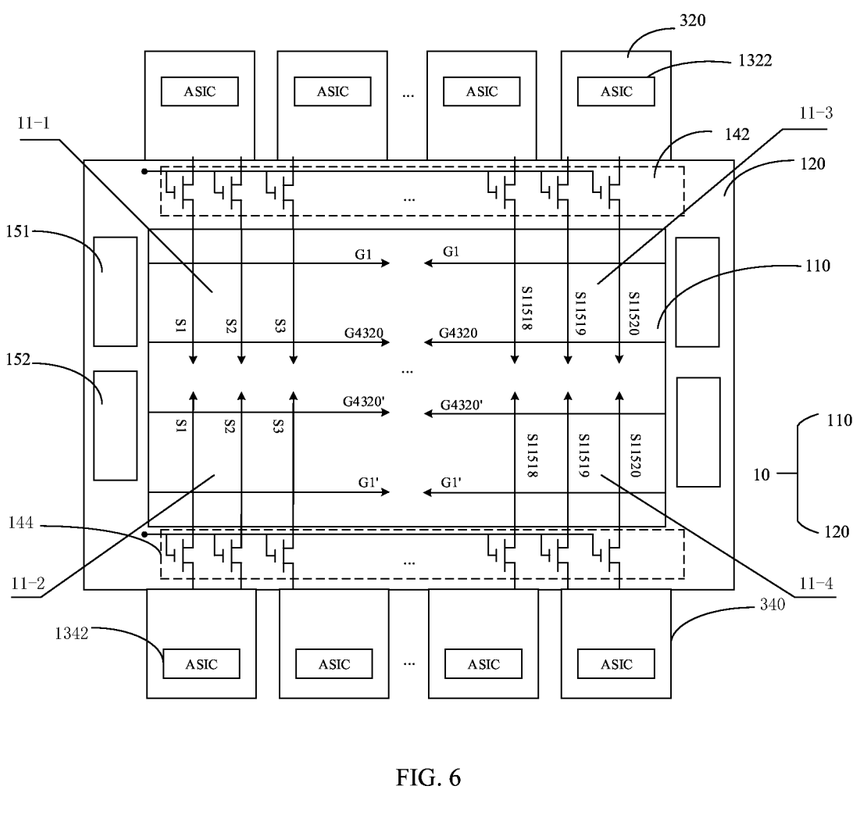
FIG. 6 is a schematic diagram of a 8K4K HSD display panel according to yet another embodiment.

Referring to FIG. 6, which is a schematic diagram of a 8K4K HSD display panel according to yet another embodiment. The display panel 10 includes at least one cascade array substrate row driving circuit 150. Each of the cascade array substrate row driving circuits 150 are located on one or both sides adjacent to the first source driving circuits 1322, and each side is provided with at least two cascade array substrate row driving circuits 150. In the illustrated embodiment, each side is provided with two cascade array substrate row driving circuits 150. For convenience of description, the two cascade array substrate row driving circuits 150 are respectively named as a first cascade array substrate row driving circuit 151 and a second cascade array substrate row driving circuit 152. When the first cascade array substrate row driving circuit 151 receives a scan enable signal, the first cascade array substrate row driving circuit 151 outputs scan line driving signals line by line along a direction from G1 to G4320, and when the second cascade array substrate row driving circuit 152 receives the scan enable signal, the second cascade array substrate row driving circuit 152 outputs scan line driving signals line by line along a direction from G1' to G4320'.

It should be understood that, when calculating the driving voltage input time of each scan line in the display panel 10, the display area 110 can be divided into four display areas: the first area 11-1, the second area 11-2, and the third area. 11-3 and fourth region 11-4. The number of scan lines per area is 4320 (8640÷2=4320), the number of data lines per area is 5760 (11520÷2=5760), and the scan line driving signal of each display area is inputted by one same cascade array substrate row driving circuit 150. Therefore, taking the first area 11-1 as an example, in the scan line G1 to G4320, the driving voltage input time of each scan line is 1/60/4320≈3.858 µs. If a side of the display area 110 (i.e., the scan line driving area) is provided with only one cascade array substrate row driving circuit 150, the driving voltage input time of each scan line is 1/60/8640≈1.929 µs. It can be seen that when two cascade array substrate row driving circuits 150 are provided at the scan line driving area, the driving voltage input time of each scan line twice as large as the driving voltage input time when only one cascade array substrate row driving circuit 150 is provided. Therefore, in the illustrated embodiment, the pixel charging time of the display area 110 is increased by two times, thereby improving the screen display effect. Furthermore, by employing the aforementioned driver selection circuit for the display panel, the switching between unilateral and bilateral input of the data signals in the display panel can be achieved.

On the one hand, when the resolution of the display panel 10 is getting higher and higher, the number of the TFT (Thin Film Transistor) switches of the display area 110 is increased, and each cascade GOA unit 150 needs to provide a larger scan line driving voltage to turn on the TFT switches of the display area 110. Therefore, in the illustrated embodiment, the cascade GOA units are respectively provided at both opposite sides of the display panel, thereby reducing the scan line driving voltage required for each GOA unit 150, and reducing the difficulty and cost of manufacturing the cascade GOA unit.

On the other hand, when the resolution of the display panel 10 is getting higher and higher, the number of scan lines required for the display area 110 is increased. If only one cascade array substrate row driving circuit is provided on the scan line driving area (i.e., the area where cascade GOA units are located in FIG. 6), the driving voltage input time of each scan line is shorter, thereby reducing the charging time of each of the pixel units (not shown) in the display area 110. For example, for a 8K4K HSD (half source driver) display panel with a resolution of 7680RGB×4320, if the scan line driving area is provided with only one cascade array substrate row driving circuit, the driving voltage input time of each scan line is 1/60/8640≈1.929 µs, and if two cascade array substrate row driving circuits are provided at the scan line driving area, the driving voltage input time of each scan line is 1/60/4320≈3.858 µs. It can be seen that, increasing the number of the cascade array substrate row driving circuits can not only reduce the manufacturing difficulty of each cascade array substrate row driving circuit, but also increase the driving voltage input time of each scan line (i.e., increase the charging time of each pixel unit of the display area 110), thereby ensuring that the display panel 10 has a good gray scale display, further improving the display effect.

Figure 7:
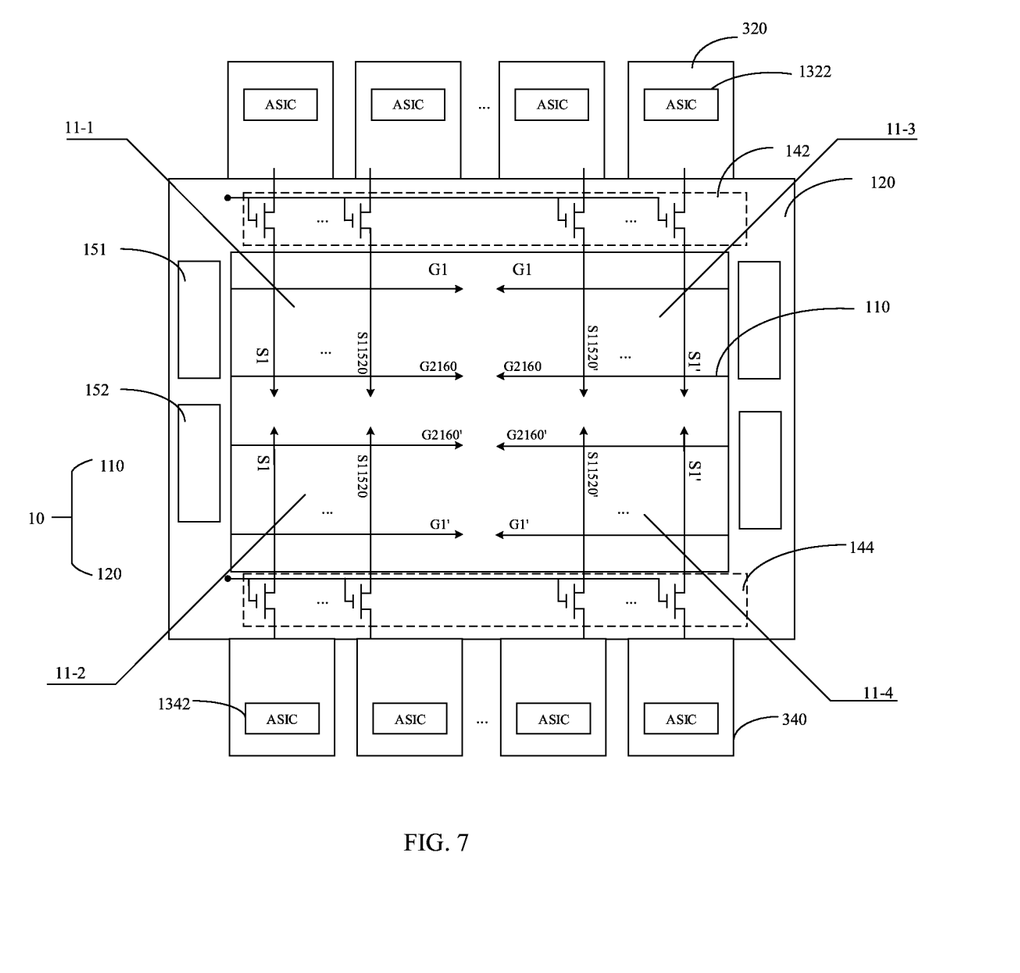
FIG. 7 is a schematic diagram of a 8K4K 1G1D display panel according to still another embodiment.

Referring to FIG. 7, which is a schematic diagram of an 8K4K 1G1D display panel according to still another embodiment. The resolution of the 8K4K 1G1D (normal driving) is 7680RGB×4320. That is, the display area 110 is provided with 7680×3=23040 data lines, and 4320 scan lines. It should be understood that, when calculating the driving voltage input time of each scan line in the display panel 20, the display area 110 can be divided into four display areas: the first area 11-1, the second area 11-2, and the third area. 11-3 and fourth region 11-4. The number of scan lines per area is 2160 (4320÷2=2160), the number of data lines per area is 11520 (23040÷2=11520), and the scan line driving signal of each display area is inputted by one same cascade array substrate row driving circuit 150. Therefore, taking the first area 11-1 as an example, in the scan line G1 to G2160, the driving voltage input time of each scan line is 1/60/2160≈7.716 µs. If a side of the display area 110 (i.e., the scan line driving area) is provided with only one cascade array substrate row driving circuit 150, the driving voltage input time of each scan line is 1/60/4320≈3.858 µs. It can be seen that when two cascade array substrate row driving circuits 150 are provided at the scan line driving area, the driving voltage input time of each scan line twice as large as the driving voltage input time when only one cascade array substrate row driving circuit 150 is provided. Therefore, in the illustrated embodiment, the pixel charging time of the display area 110 is increased by two times, thereby improving the screen display effect. Furthermore, by employing the aforementioned driver selection circuit for the display panel, the switching between unilateral and bilateral input of the data signals in the display panel can be achieved.

Figure 8:
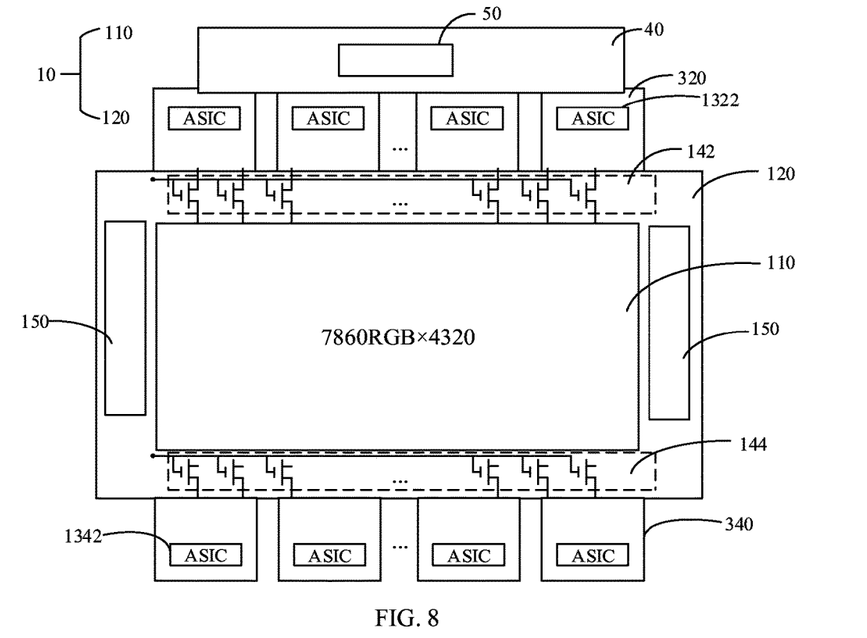
FIG. 8 is a schematic diagram of a display device according to an embodiment.

Referring to FIG. 8, which is a schematic diagram of a display device according to an embodiment. The display device may include the display panel 10 described above. Further, the display panel 10 is an 8K4K display panel. Referring to FIG. 8 again, the display device may further include a plurality of first flexible circuit boards 320 and a plurality of second flexible circuit boards 340 located on the edge of the non-display area 120. The first flexible circuit boards 320 are located on one side of the display panel 10, and the second flexible circuit boards 340 are located on the opposite side, the first source driving circuits 1322 are located on the first flexible circuit boards 320, and the second source driving circuits 1342 are located on the second flexible circuit boards 340. It further includes a printed circuit board 40 electrically coupled to the first flexible circuit boards 320 or the second flexible circuit boards 340. The display device further includes a timing controller 50 located on the printed circuit board 40, and the timing controller 50 is used to output a clock control signal. Both side of the source driving unit 132 are provided with one array substrate row driving circuit 150, respectively. It should be understood that, the display panel 10 and the array substrate row driving circuit 150 can be referred to the descriptions of the aforementioned embodiments, and are not further described herein.

Furthermore, the first flexible circuit board 320 and the second flexible circuit board 340 are made of polyimide or polyester film, and are highly reliable and excellent flexible printed circuit boards (FPC). It can be understood that, the number of the first flexible circuit boards 320 or the second flexible circuit boards 340 is plural, and each of the first flexible circuit boards 320 is provided with only one first source driving circuit 1322, and each of the second flexible circuit boards 340 is provided with only one second source driving circuit 1342. The first flexible circuit board 320 is generally used as a carrier for receiving the source driving unit 1322 and a bridge connecting the display panel 10 and the printed circuit board 40, so as the second flexible circuit board 340. The first source driving circuit 1322 is electrically coupled to the timing controller 50 via the first flexible circuit board 340, and is configured to receive the clock control signal output by the timing controller 50, and drive the corresponding data line 112 to be turned on or off according to the clock control signal. The first source driving circuit 1322 and the second source driving circuit 1342 are also referred as a source thin film driving chip, also referred as S-COF (Source-Chip on Film), and generate a strobe signal mainly based on the clock control signal. The strobe signal is the data line driving voltage signal, which is used to control the writing of the data signals. Printed circuit board 40 can be referred as PCB. The printed circuit board 40 is an important electronic component and is a support for electronic components, and is mainly used as a carrier for electrical connection of electronic components. The timing controller 50 is mainly configured to process the R (Red)/G (Green)/B (Blue) compressed signals and control signals sent by the system board, and then generate corresponding clock control signals.

In the aforementioned embodiment, by employing the driver selection circuit for the display panel with a multiplexer circuit, the switching between unilateral and bilateral input of the data under the request of smaller size and high quality is achieved. Moreover, by providing one array substrate row driving circuit on left and rights of the display panel, respectively, the charging time of the pixel units is increased, thereby improving the display effect of the display device.

Figure 9:
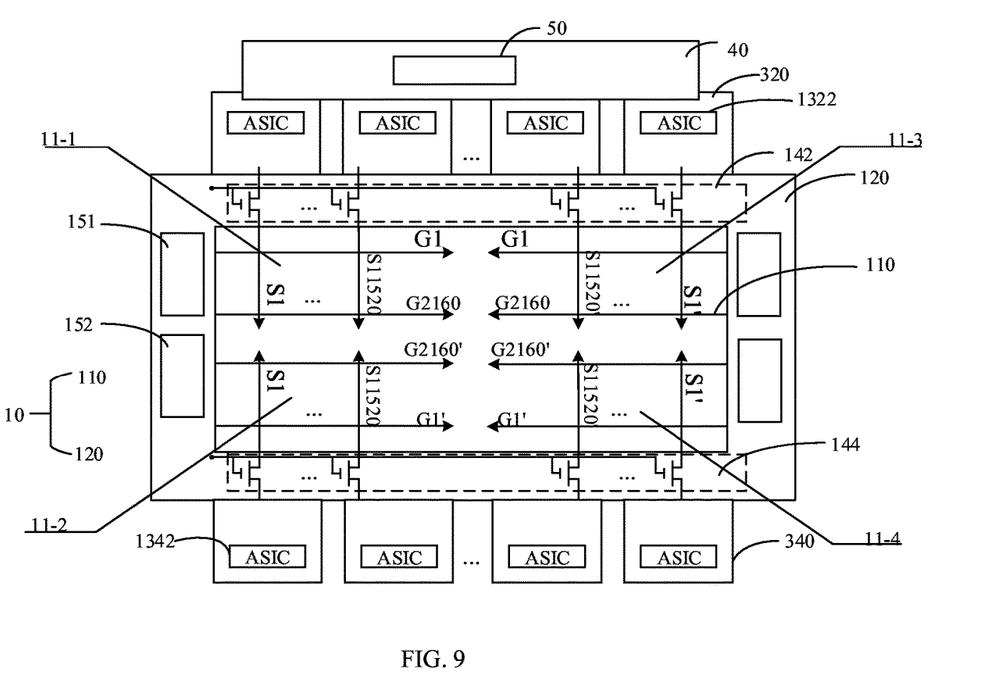
FIG. 9 is a schematic diagram of a display device according to another embodiment.

Referring to FIG. 9, which is a schematic diagram of a display device according to another embodiment. The display device may include the display panel 10 described above. Further, the display panel 10 is an 8K4K 1G1D display panel. Referring to FIG. 9 again, the display device may further include a plurality of first flexible circuit boards 320 and a plurality of second flexible circuit boards 340 located on the edge of the non-display area 120. The first flexible circuit boards 320 are located on one side of the display panel 10, and the second flexible circuit boards 340 are located on the opposite side, the first source driving circuits 1322 are located on the first flexible circuit boards 320, and the second source driving circuits 1342 are located on the second flexible circuit boards 340. It further includes a printed circuit board 40 electrically coupled to the first flexible circuit boards 320 or the second flexible circuit boards 340. The display device further includes a timing controller 50 located on the printed circuit board 40, and the timing controller 50 is used to output a clock control signal. Both side of the source driving unit 132 are provided with two array substrate row driving circuits 150, respectively. It should be understood that, the display panel 10 and the cascade array substrate row driving circuit 150 can be referred to the descriptions of the aforementioned embodiments, and are not further described herein.

For a high-resolution display panel, such as an 8K4K 1G1D display panel, when the size of the display panel is reduced (for example, less than 32 inches), the flexible circuit board connected to the source driving unit cannot be fully placed on one side of the display panel, therefore the source driving unit is required to be placed separately at both sides. By providing array substrate row driving circuits 150 on two sides of the display panel 10, the space of the array substrate row driving circuits is saved, thus the fabrication of a small-sized (less than 32-inch) and high-resolution (8K4K) display panel is realized. Furthermore, by providing multiplexer circuit in the display device, the switching between unilateral and bilateral writing of the data can be achieved.

The technical features of the embodiments described above can be arbitrarily combined. In order to make the description succinct, there is no describing of all possible combinations of the various technical features in the foregoing embodiments. It should be noted that there is no contradiction in the combination of these technical features which should be considered as the scope of the description.

Although the present disclosure is illustrated and described herein with reference to specific embodiments, the present disclosure is not intended to be limited to the details shown. It is to be noted that, various modifications may be made in the details within the scope and range of equivalents of the claims and without departing from the present disclosure. Therefore, the protection scope of the present disclosure shall be subject to the protection scope of the claims.

What is claimed is:

1. A driver selection circuit for a display panel, the display panel comprising a display area and a non-display area, the display area being provided with a plurality of data lines, wherein the driver selection circuit for the display panel comprises:
a data driving circuit, comprising a first data driving circuit and a second data driving circuit, the first data driving circuit being located on a side of the display panel, and the second data driving circuit being located on an opposite side of the display panel, the first data driving circuit comprising a plurality of first source driving circuits, and the second data driving circuit comprising a plurality of second source driving circuits; and
a multiplexer circuit, comprising a first multiplexer circuit and a second multiplexer circuit, the first multiplexer circuit being located between the display area and the first data driving circuit and being separated from the first data driving circuit, and the second multiplexer circuit being located between the display area and the second data driving circuit and being separated from the second data driving circuit, the first multiplexer circuit comprising a plurality of first switching devices, and the second multiplexer circuit comprising a plurality of second switching devices; wherein each of the first source driving circuits is connected to part of the first switching devices, and each of the second source driving circuits is connected to part of the second switching devices, each of the first switching devices has a terminal connected to a first signal output terminal of the first multiplexer circuit, and each of the second switching devices has a terminal connected to a second signal output terminal of the second multiplexer circuit, wherein when the first signal output terminal and the second signal output terminal both receive a high level, the first multiplexer circuit controls all the first switching devices to be simultaneously turned on, and the second multiplexer circuit controls all the second switching devices to be simultaneously turned on, so that data driving voltage signals output from the first source driving circuits and the second source driving circuits are input to the plurality of data lines to achieve a bilateral input of data signals in the display panel; when the first signal output terminal receives a low level and the second signal output terminal receives a high level, the first multiplexer circuit controls all the first switching devices to be simultaneously turned off, and the second multiplexer circuit controls all the second switching devices to be simultaneously turned on, so that data driving voltage signals output from the second source driving circuits are input to the plurality of data lines to achieve an unilateral input of data signals in the display panel; and when the first signal output terminal receives a high level and the second signal output terminal receives a low level, the first multiplexer circuit controls all the first switching devices to be simultaneously turned on, and the second multiplexer circuit controls all the second switching devices to be simultaneously turned off, so that data driving voltage signals output from the first source driving circuits are input to the plurality of data lines to achieve the unilateral input of data signals in the display panel.

2. The driver selection circuit for the display panel according to claim 1, wherein the first and the second switching device are thin film transistors; gates of each of the thin film transistors in the first multiplexer circuit are connected to the first signal output terminal of the first multiplexer circuit, and gates of each of the thin film transistors in the second multiplexer circuit are connected to the second signal output terminal of the second multiplexer circuit, sources of each of the thin film transistors are connected to data output terminals of the data lines, and drains of the thin film transistors are connected to data input terminals of the data lines in the display area.

3. A display panel using a driver selection circuit for the display panel to drive, the display panel comprising a display area and a non-display area, the display area being provided with a plurality of data lines, wherein the driver selection circuit for the display panel comprises:
  a data driving circuit, comprising a first data driving circuit and a second data driving circuit, the first data driving circuit being located on a side of the display panel, and the second data driving circuit being located on an opposite side of the display panel, the first data driving circuit comprising a plurality of first source driving circuits, and the second data driving circuit comprising a plurality of second source driving circuits; and
  a multiplexer circuit, comprising a first multiplexer circuit and a second multiplexer circuit, the first multiplexer circuit being located between the display area and the first data driving circuit and being separated from the first data driving circuit, and the second multiplexer circuit being located between the display area and the second data driving circuit and being separated from the second data driving circuit, the first multiplexer circuit comprising a plurality of first switching devices, and the second multiplexer circuit comprising a plurality of second switching devices; wherein each of the first source driving circuits is connected to part of the first switching devices, and each of the second source driving circuits is connected to part of the second switching devices, each of the first switching devices has a terminal connected to a first signal output terminal of the first multiplexer circuit, and each of the second switching devices has a terminal connected to a second signal output terminal of the second multiplexer circuit, wherein when the first signal output terminal and the second signal output terminal both receive a high level, the first multiplexer circuit controls all the first switching devices to be simultaneously turned on, and the second multiplexer circuit controls all the second switching devices to be simultaneously turned on, so that data driving voltage signals output from the first source driving circuits and the second source driving circuits are input to the plurality of data lines to achieve a bilateral input of data signals in the display panel; when the first signal output terminal receives a low level and the second signal output terminal receives a high level, the first multiplexer circuit controls all the first switching devices to be simultaneously turned off, and the second multiplexer circuit controls all the second switching devices to be simultaneously turned on, so that data driving voltage signals output from the second source driving circuits are input to the plurality of data lines to achieve an unilateral input of data signals in the display panel; and when the first signal output terminal receives a high level and the second signal output terminal receives a low level, the first multiplexer circuit controls all the first switching devices to be simultaneously turned on, and the second multiplexer circuit controls all the second switching devices to be simultaneously turned off, so that data driving voltage signals output from the first source driving circuits are input to the plurality of data lines to achieve the unilateral input of data signals in the display panel.

4. The display panel according to claim 3, wherein the display area of the display panel is further provided with a plurality of grating lines, the plurality of grating lines extend along a first direction, and are arranged along a second direction; the plurality of data lines extend along the second direction, and are arranged along the first direction; the first direction and the second direction are perpendicular to each other.

5. The display panel according to claim 3, wherein the display panel comprises at least one array substrate row driving circuit, each of the array substrate row driving circuits are located on one or both sides adjacent to the first source driving circuits, and the array substrate row driving circuit is configured to output a scan driving voltage signal to drive the grating lines to turn on or off.

6. The display panel according to claim 3, wherein the display panel comprises at least one cascade array substrate row driving circuit, each of the cascade array substrate row driving circuits are located on one or both sides adjacent to the first source driving circuits, and each side is provided with at least two cascade array substrate row driving circuits.

7. The display panel according to claim 3, wherein the display panel comprises two array substrate row driving circuits, the two array substrate row driving circuits are located on both sides adjacent to the first source driving circuits, respectively, and the array substrate row driving circuits are configured to output a scan driving voltage signal to drive the grating lines to turn on or off.

8. The display panel according to claim 7, wherein a resolution of the display panel is 7680RGB×4320.

9. The display panel according to claim 7, wherein the display panel is a half source driving display panel with a resolution of 7680RGB/2×4320*2.

10. The display panel according to claim 3, wherein the display panel comprises four cascade array substrate row driving circuits, two of the cascade array substrate row driving circuits are located on both sides adjacent to the first source driving circuits, and other two cascade array substrate row driving circuits are located on the opposite side.

11. The display panel according to claim 10, wherein the display panel is a normal driving display panel with a resolution of 7680RGB/2×4320*2.

12. The display panel according to claim 3, wherein the display panel is a liquid crystal display panel.

13. The display panel according to claim 3, wherein the display panel is an organic electroluminescent display panel.

14. The display panel according to claim 3, wherein the display panel is a quantum-dot light-emitting display panel.

15. The display panel according to claim 3, wherein the display panel is a liquid curved surface display panel.

16. A display device comprising a display panel, the display panel using a driver selection circuit for the display panel to drive, the display panel comprising a display area and a non-display area, the display area being provided with a plurality of data lines, wherein the driver selection circuit for the display panel comprises:
 a data driving circuit, comprising a first data driving circuit and a second data driving circuit, the first data driving circuit being located on a side of the display panel, and the second data driving circuit being located on an opposite side of the display panel, the first data driving circuit comprising a plurality of first source driving circuits, and the second data driving circuit comprising a plurality of second source driving circuits; and
 a multiplexer circuit, comprising a first multiplexer circuit and a second multiplexer circuit, the first multiplexer circuit being located between the display area and the first data driving circuit and being separated from the first data driving circuit, and the second multiplexer circuit being located between the display area and the second data driving circuit and being separated from the second data driving circuit, the first multiplexer circuit comprising a plurality of first switching devices, and the second multiplexer circuit comprising a plurality of second switching devices; wherein each of the first source driving circuits is connected to part of the first switching devices, and each of the second source driving circuits is connected to part of the second switching devices, each of the first switching devices has a terminal connected to a first signal output terminal of the first multiplexer circuit, and each of the second switching devices has a terminal connected to a second signal output terminal of the second multiplexer circuit, wherein when the first signal output terminal and the second signal output terminal both receive a high level, the first multiplexer circuit controls all the first switching devices to be simultaneously turned on, and the second multiplexer circuit controls all the second switching devices to be simultaneously turned on, so that data driving voltage signals output from the first source driving circuits and the second source driving circuits are input to the plurality of data lines to achieve a bilateral input of data signals in the display panel; when the first signal output terminal receives a low level and the second signal output terminal receives a high level, the first multiplexer circuit controls all the first switching devices to be simultaneously turned off, and the second multiplexer circuit controls all the second switching devices to be simultaneously turned on, so that data driving voltage signals output from the second source driving circuits are input to the plurality of data lines to achieve an unilateral input of data signals in the display panel; and when the first signal output terminal receives a high level and the second signal output terminal receives a low level, the first multiplexer circuit controls all the first switching devices to be simultaneously turned on, and the second multiplexer circuit controls all the second switching devices to be simultaneously turned off, so that data driving voltage signals output from the first source driving circuits are input to the plurality of data lines to achieve the unilateral input of data signals in the display panel.

17. The display device according to claim 16, further comprising a plurality of first flexible circuit boards and a plurality of second flexible circuit boards located on edges of the non-display area, the first flexible circuit boards are located on one side of the display panel, and the second flexible circuit boards are located on the opposite side, the first source driving circuits are located on the first flexible circuit boards, and the second source driving circuits are located on the second flexible circuit boards.

18. The display device according to claim 17, wherein the display device further comprise a printed circuit board connected to the first flexible circuit boards.

19. The display device according to claim 17, wherein the display device further comprise a printed circuit board connected to the second flexible circuit boards.

20. The display device according to claim 18, wherein the display device further comprise a timing controller located on the printed circuit board, the timing controller is configured to output a clock control signal.

\* \* \* \* \*